US012755934B2

(12) United States Patent
Dash et al.

(10) Patent No.: US 12,755,934 B2
(45) Date of Patent: Oct. 6, 2026

(54) PULSED VOLTAGE WAVEFORM WITH BINARY PULSES FOR BIASING OF PLASMA

(71) Applicant: Applied Materials, Inc., Santa Clara, CA (US)

(72) Inventors: Shreeram Jyoti Dash, San Jose, CA (US); Takumi Yanagawa, Santa Clara, CA (US); Sonam Dorje Sherpa, Santa Clara, CA (US); A N M Wasekul Azad, Santa Clara, CA (US); Zhuangfei Chen, Santa Clara, CA (US); Geuntak Lee, Santa Clara, CA (US); Zhiqi Hu, Santa Clara, CA (US); Kyung Hoon Kim, Santa Clara, CA (US); Hailong Zhou, San Jose, CA (US); Jiajing Li, Santa Clara, CA (US); Alok Ranjan, Santa Clara, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

(21) Appl. No.: 18/901,389

(22) Filed: Sep. 30, 2024

(65) Prior Publication Data

US 2026/0094787 A1 Apr. 2, 2026

(51) Int. Cl.
*H01J 37/32* (2006.01)

(52) U.S. Cl.
CPC .. *H01J 37/32146* (2013.01); *H01J 37/32128* (2013.01); *H01J 37/32183* (2013.01); *H01J 37/32935* (2013.01); *H01J 2237/3341* (2013.01)

(58) Field of Classification Search
CPC ........... H01J 37/32009; H01J 37/32128; H01J 37/32146; H01J 37/32183;
(Continued)

(56) References Cited

U.S. PATENT DOCUMENTS 11,848,176 B2 12/2023 Dorf et al.
2011/0223750 A1* 9/2011 Hayashi ................ H10P 50/283 438/758
(Continued)

FOREIGN PATENT DOCUMENTS

CN 103943448 A 7/2014
JP 2009-187975 A 8/2009
WO 2024091796 A1 5/2024

OTHER PUBLICATIONS

International Search Report and Written Opinion for PCT/US2025/045469 Dated Jan. 8, 2026.

*Primary Examiner* — Jason M Crawford
(74) *Attorney, Agent, or Firm* — Patterson + Sheridan, LLP

(57) ABSTRACT

Methods and apparatus for forming a discrete multimodal ion energy distribution function (IEDF)-containing plasma. One example method generally includes generating a first burst of a first plurality of pulses by delivering, in a first pulsing state, a first pulse of the first plurality of pulses within a first burst of pulses, and delivering, in the first pulsing state, a second pulse of the first plurality of pulses within the first burst of pulses. The example method also generally incudes generating a second burst of a second plurality of pulses by delivering, in a second pulsing state, a third pulse of the second plurality of pulses within a second burst of pulses, and delivering, in the second pulsing state, a fourth pulse of the second plurality of pulses within the second burst of pulses, where the first voltage, the second voltage, the third voltage, and the fourth voltage are each different.

17 Claims, 9 Drawing Sheets

(58) Field of Classification Search
CPC ............. H01J 37/32211; H01J 37/3266; H01J 37/32798; H01J 37/32917; H01J 37/32935; H05H 1/00; H05H 1/24
See application file for complete search history.

(56) References Cited

U.S. PATENT DOCUMENTS

| | | | | |
|---|---|---|---|---|
| 2014/0234554 | A1* | 8/2014 | Radovanov | H01J 37/32706 118/723 FE |
| 2017/0040174 | A1* | 2/2017 | Long | H01J 37/321 |
| 2019/0066979 | A1* | 2/2019 | Shoeb | H01J 37/32146 |
| 2019/0131110 | A1* | 5/2019 | Ziemba | H01J 37/32146 |
| 2019/0148114 | A1* | 5/2019 | Wu | H01J 37/32183 156/345.48 |
| 2020/0168437 | A1* | 5/2020 | Ziemba | H01J 37/32706 |
| 2020/0266022 | A1 | 8/2020 | Dorf et al. | |
| 2021/0104382 | A1* | 4/2021 | Kim | H01J 37/32183 |
| 2021/0335578 | A1 | 10/2021 | Nagami | |
| 2022/0037119 | A1* | 2/2022 | Dorf | H01J 37/32128 |
| 2022/0037121 | A1* | 2/2022 | Dorf | H01J 37/32128 |
| 2022/0157561 | A1* | 5/2022 | Cui | C23C 16/4586 |
| 2022/0157577 | A1* | 5/2022 | Cui | H01J 37/32706 |
| 2022/0399183 | A1* | 12/2022 | Cui | H01J 37/32146 |
| 2022/0399186 | A1* | 12/2022 | Cui | H01J 37/32146 |
| 2022/0406567 | A1* | 12/2022 | Yang | H01J 37/32128 |
| 2022/0415615 | A1* | 12/2022 | Cubaynes | H01J 37/32128 |
| 2023/0132339 | A1* | 4/2023 | Dhindsa | H01J 37/32146 438/798 |
| 2023/0178336 | A1* | 6/2023 | Rogers | H01J 37/32128 438/714 |
| 2024/0030002 | A1* | 1/2024 | Dorf | H01J 37/32128 |
| 2024/0079212 | A1* | 3/2024 | Guo | H01J 37/32183 |
| 2024/0153741 | A1* | 5/2024 | Cui | H01J 37/32128 |
| 2024/0162007 | A1* | 5/2024 | Li | H01J 37/32128 |
| 2024/0177968 | A1* | 5/2024 | Azad | H01J 37/32146 |
| 2024/0177969 | A1* | 5/2024 | Ramaswamy | H01J 37/32128 |
| 2025/0006478 | A1* | 1/2025 | Burry | H01J 37/3299 |
| 2025/0191884 | A1* | 6/2025 | Dash | H01J 37/32174 |
| 2026/0094787 | A1* | 4/2026 | Dash | H01J 37/32146 |

* cited by examiner

PULSED VOLTAGE WAVEFORM WITH BINARY PULSES FOR BIASING OF PLASMA

BACKGROUND

Field

Embodiments described herein generally relate to a system and methods used in semiconductor device fabrication. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical RIE plasma processing chamber includes a radio frequency (RF) bias generator, which supplies an RF voltage to a "power electrode" (e.g., a biasing electrode), such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using an RF generator that is coupled to an RF electrode through an RF matching network ("RF match") that tunes the apparent load to 50Ω to minimize the reflected power and maximize the power delivery efficiency. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF).

In plasmas that utilize an RF bias, the IEDF is bimodal and typically has two non-discrete peaks, one at a low energy and one at a high energy, and an ion population that has a range of energies that extend between the two peaks. The separation of the two peaks and the relative intensity of the peaks is fixed, and is associated with the source frequency of the RF bias frequency. The presence of the ion population in-between the two peaks of the IEDF is reflective of the fact that the voltage drop between the substrate and the plasma oscillates at the RF bias frequency. For example, with an RF bias source frequency of 60 MHz, the two peaks may effectively collapse into a single broad peak, whereas RF bias source frequency of 400 kHz results in two peaks, a low energy peak and a high energy peak, that are spread out.

When a lower frequency RF bias generator is used to achieve higher self-bias voltages, the difference in energy between these two peaks can be significant, and because the etch profile due to the ions at low energy peak is more isotropic, this could potentially lead to bowing of the etched feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. Feature sizes continue to diminish and aspect ratio continues to increase, resulting in more stringent feature profile control requirements.

Accordingly, there is a need in the art for apparatus and methods that provide a well-controlled and customizable IEDF at the substrate surface during plasma processing applications.

SUMMARY

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

Embodiments provided herein generally include apparatus, e.g., plasma processing systems, and methods for the plasma processing of a substrate in a processing chamber.

Embodiments of the present disclosure are directed to a method of forming a discrete multimodal ion energy distribution function (IEDF)-containing plasma. The method generally includes generating a first burst of a first plurality of pulses and generating a second burst of a second plurality of pulses. Generating the first burst of the first plurality of pulses generally includes: delivering, in a first pulsing state, a first pulse of the first plurality of pulses within a first burst of pulses, where the first pulse includes a first voltage, a first period, and a first pulse-on-time (POT) within the first period; and delivering, in the first pulsing state, a second pulse of the first plurality of pulses within the first burst of pulses, where the second pulse includes a second voltage, a second period, and a second POT within the second period; and generating a second burst of a second plurality of pulses. Generating the second burst of the second plurality of pulses generally includes: delivering, in a second pulsing state, a third pulse of the second plurality of pulses within a second burst of pulses, where the third pulse includes a third voltage, a third period, and a third POT within the third period; and delivering, in the second pulsing state, a fourth pulse of the second plurality of pulses within the second burst of pulses, where the fourth pulse includes a fourth voltage, a fourth period, and a fourth POT within the third period, and where the first voltage, the second voltage, the third voltage, and the fourth voltage are each different.

Embodiments of the present disclosure are directed to a method of forming a discrete multimodal IEDF-containing plasma. The method generally includes generating a first burst of a first plurality of pulses and generating a second burst of a second plurality of pulses. Generating a first burst of a first plurality of pulses generally includes delivering, in a first pulsing state, a first pulse of the first plurality of pulses within a first burst of pulses, where the first pulse includes a first voltage, a first period, and a first POT within the first period; and delivering, in the first pulsing state, a second pulse of the first plurality of pulses within the first burst of pulses, where the second pulse includes a second voltage, a second period, and a second POT within the second period, and where at least one of the generating of the first pulse burst is delayed for a first sub-period of time or the generating of the first pulse burst is halted for a second sub-period. Generating the second burst of a second plurality of pulses generally includes: delivering, in a second pulsing state, a third pulse of the second plurality of pulses within a second burst of pulses, where the third pulse includes a third voltage, a third period, and a third POT within the third period; and delivering, in the second pulsing state, a fourth pulse of the second plurality of pulses within the second burst of pulses, where the fourth pulse includes a fourth voltage, a fourth period, and a fourth POT within the third period, and where the first voltage, the second voltage, the third voltage, and the fourth voltage are each different.

Embodiments of the present disclosure are directed to a waveform generator. The waveform generator generally includes a system controller coupled to the waveform generator, the system controller including memory that includes computer-executable instructions and one or more processors configured to execute the computer-executable instructions and, individually or collectively, cause the waveform generator to generate a first burst of a first plurality of pulses and a second burst of a second plurality of pulses. The one or more processors are configured to execute the computer-executable instructions and, individually or collectively, cause the waveform generator to generate the first burst of the first plurality of pulses by: delivering, in a first pulsing state, a first pulse of the first plurality of pulses within a first burst of pulses, where the first pulse includes a first voltage, a first period, and a first POT within the first period; and delivering, in the first pulsing state, a second pulse of the first plurality of pulses within the first burst of pulses, where the second pulse includes a second voltage, a second period, and a second POT within the second period. The one or more processors are further configured to execute the computer-executable instructions and, individually or collectively, cause the waveform generator to generate the second burst of the second plurality of pulses by: delivering, in a second pulsing state, a third pulse of the second plurality of pulses within a second burst of pulses, where the third pulse includes a third voltage, a third period, and a third POT within the third period; and delivering, in the second pulsing state, a fourth pulse of the second plurality of pulses within the second burst of pulses, where the fourth pulse includes a fourth voltage, a fourth period, and a fourth POT within the third period, and where the first voltage, the second voltage, the third voltage, and the fourth voltage are each different.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to apparatus and methods for providing direct current (DC) voltage bias for plasma-assisted substrate processing in a plasma processing system. More specifically, DC voltage bias in the plasma processing system may be provided using a plurality of pulse bursts that include a plurality of voltage pulses and form part of a pulsed voltage (PV) waveform. The plurality of pulse bursts that include the plurality of voltage pulses are delivered to a substrate disposed in the plasma processing system and may be adjusted to control at least one of an ion energy or a total ion flux of an ion energy distribution function (IEDF) at a surface of the substrate processed in the plasma processing system. In some embodiments, the ion energy and/or the total ion flux of the IEDF may be controlled by adjusting at least one of the magnitude of the applied voltage or the pulse-on-time (POT) of one or more of the plurality of pulses within at least one of the plurality of pulse bursts (e.g., to manipulate the ratio of the applied voltage and/or the POT of the plurality of pulses in one pulse burst of the plurality of pulse bursts to the applied voltage and/or the POT of the plurality of pulses in another pulse burst of the plurality of pulse bursts). In this manner, the plurality of pulse bursts may be used to effectively form a discrete two peak (e.g., bimodal) IEDF-containing plasma that is customizable for various plasma-assisted processes in the plasma processing system.

Processing System Examples

Figure 1:
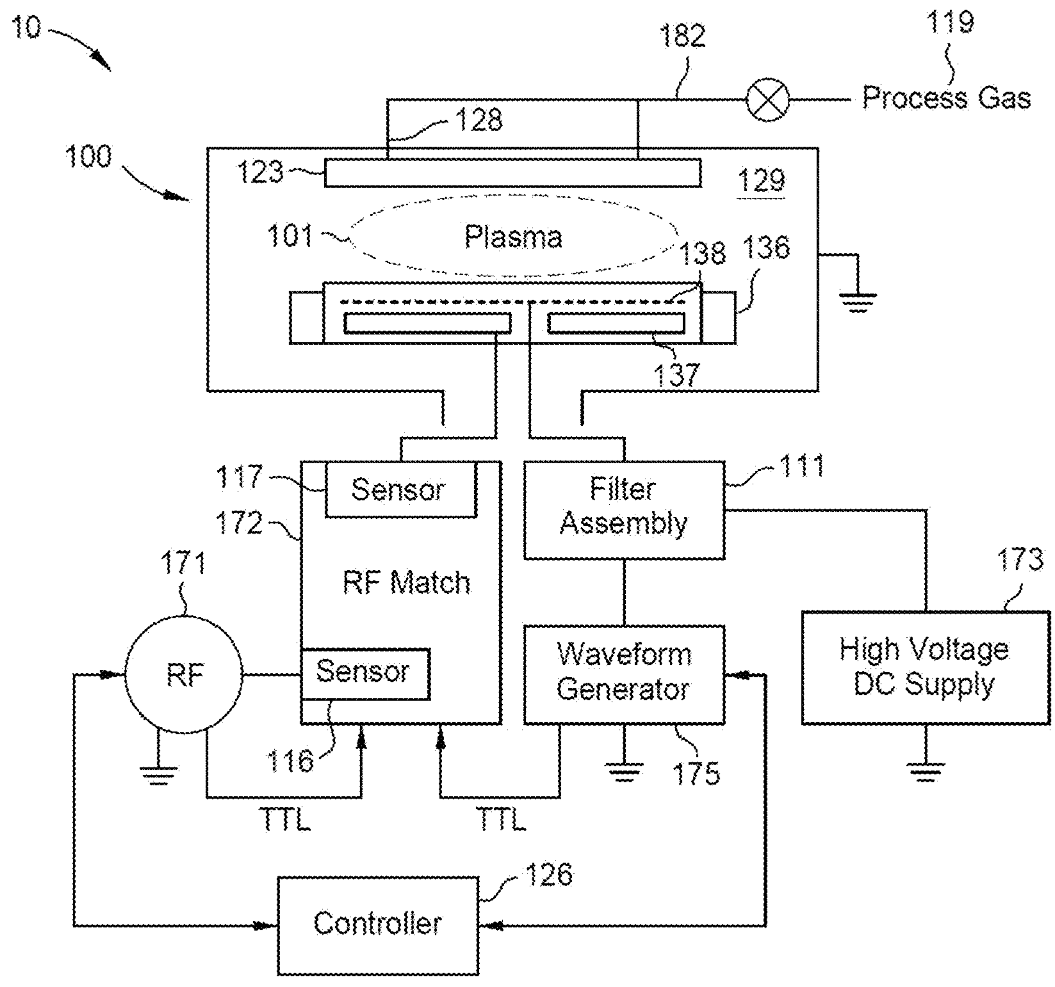
FIG. 1 is a schematic representation of an example processing system, in which embodiments of the present disclosure may be implemented.

FIG. 1 is a schematic representation of an example processing system 10. The plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In some embodiments, as shown in FIG. 1, the plasma processing system 10 is configured to form a capacitively-coupled-plasma (CCP). In other embodiments, a plasma may alternately be generated by an inductively coupled plasma (ICP) source disposed over a processing region of the plasma processing system 10.

The plasma processing system 10 includes a processing chamber 100, a substrate support assembly 136, a gas delivery system 182, a high voltage direct current (DC) supply 173, a RF generator 171, and an RF match 172 (e.g., RF impedance matching network). A chamber lid 123 includes one or more sidewalls and a chamber base that are configured to withstand the pressures and energy applied to them while a plasma 101 is generated within a vacuum environment maintained in a processing volume 129 of the processing chamber 100 during processing.

The gas delivery system 182, which is coupled to the processing volume 129 of the processing chamber 100 is configured to deliver at least one processing gas from at least one processing gas source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gasses to the processing volume 129 of the processing chamber 100.

The processing chamber 100 includes a chamber lid 123 and a substrate support assembly 136 positioned in the processing volume 129 of the processing chamber 100. In some embodiments, the chamber lid 123 is grounded and thus acts as an upper electrode during plasma processing. In some embodiments, the RF generator 171 is electrically coupled to a first lower electrode, such as the RF baseplate 137. The RF generator 171 is configured to deliver an RF signal to ignite and maintain the plasma 101 between the upper and lower electrodes. In one example, the RF generator 171 may deliver an RF source power to the RF baseplate 137 within the substrate support assembly 136 (e.g., a cathode assembly) for plasma production. However, in some alternative configurations, the RF generator 171 can be electrically coupled to the upper electrode. A center frequency of the RF source power can be from 13.56 MHz to very high frequency band such as 40 MHz, 60 MHz, 120 MHz or 162 MHz. The RF source power can be operated in a continuous mode or a pulsed mode. A pulsing frequency of the RF power can be from 100 to 10 kHz, and duty cycles are ranging from 5% to 95%. The RF generator 171 has a frequency tuning capability and can adjust its RF power frequency within e.g., ±5% or ±10%. In some embodiments, the RF generator 171 switches the RF power frequency at a predefined speed (e.g., two nanoseconds, fifty nanoseconds, etc.).

The substrate support assembly 136 is coupled to the RF generator 171 configured to deliver an RF signal to the processing volume 129 of the processing chamber 100. The RF generator 171 is electronically coupled to the RF match 172 disposed between the RF generator 171 and the processing volume 129 of the processing chamber 100. For example, the RF match 172 is an electrical circuit used between the RF generator 171 and a plasma reactor (e.g., the processing volume 129 of the processing chamber 100) to optimize power delivery efficiency. One or more RF filters (e.g., within the RF match 172) are designed to only allow powers in a selected frequency range, and to isolate RF power supplies from each other. In some cases, a bandwidth of an RF filter has to be larger than a frequency tuning range of the RF generator 171.

During the plasma processing, the RF generator 171 delivers an RF signal to the RF baseplate 137 of the substrate support assembly 136 via the RF match 172. For example, the RF signal is applied to a load (e.g., gas) in the processing volume 129 of the processing chamber 100. If an impedance of the load is not properly matched to an impedance of a source (e.g., the RF generator 171), a portion of a waveform can reflect back in an opposite direction. Accordingly, to prevent a substantial portion of the waveform from reflecting back, it is necessary to find a match impedance (e.g., a matching point) by adjusting one or more components of the RF match 172 as the source and load impedances change.

The RF match 172 is electrically coupled to the RF generator 171, the substrate support assembly 136, and the PV waveform generator 175. The RF match 172 is configured to receive a synchronization signal from either or both of the RF generator 171 and the PV waveform generator 175.

The substrate support assembly 136 may be coupled to a high voltage DC supply 173 that supplies a chucking voltage thereto. The high voltage DC supply 173 may be coupled to a filter assembly 178 that is disposed between the high voltage DC supply 173 and the substrate support assembly 136. The filter assembly 178 is configured to electronically isolate the high voltage DC supply 173 during plasma processing. In one configuration, a static DC voltage is between about −5000V and about +5000V, and is delivered using an electrical conductor (such as a coaxial power delivery line). The filter assembly 178 may include multiple filtering components or a single common filter.

The substrate support assembly 136 is also coupled to a PV waveform generator 175 configured to supply a PV to an electrode within the substrate support assembly 136 to bias a substrate disposed on the substrate support. The PV waveform generator 175 may be coupled to the RF baseplate 137 or a second electrode disposed within the substrate support assembly 136, such as the chucking electrode 138. The PV waveform generator 175 is coupled to the filter assembly 178, which is coupled to the electrode disposed within the substrate support assembly 136. The filter assembly 178 is disposed between the PV waveform generator 175 and the substrate support assembly 136. The filter assembly 178 is configured to electronically isolate the PV waveform generator 175 from at least the RF signal provided by the RF generator 171 during plasma processing.

The RF generator 171 and the PV waveform generator 175 are each directly coupled to a system controller 126. The system controller 126 may synchronize the respective generated RF signal and PV waveform.

Voltage and current sensors can be placed at an input and/or output of the RF match 172 to measure impedance and other parameters. These sensors can be synchronized using an external transistor-transistor logic (TTL) synchronization signal from an advanced waveform generator and/or RF generators or using measured voltage and current data to determine timing internally. For example, an output sensor 117 is configured to measure the impedance of the plasma processing chamber 100, and other characteristics such as the voltage, current, harmonics, phase, and/or the like. An input sensor 116 is configured to measure the impedance of the RF generator 171 and other characteristics such as the voltage, current, harmonics, phase, and/or the like. Based on either of the synchronization signals or the characteristics of the plasma processing chamber 100, the RF match 172 is able to capture fast impedance changes and optimize impedance matching.

The PV waveform generator 175 is used to supply a PV waveform and/or a tailored voltage waveform, which is a sum of harmonic frequencies associated with the waveform. The PV waveform generator 175 may output a synchronization TTL signal to the RF match 172. The voltage waveform is coupled to a bias electrode through the filter assembly 178. The high voltage DC supply 173 is applied to chuck a wafer during a process for a thermal control. In some cases, there can be a third electrode at an edge of the cathode assembly for edge uniformity control.

The system controller 126 may include a programmable central processing unit (CPU) and/or one or more processors which are operable with a memory (e.g., non-volatile memory). The CPU is one of any form of general purpose computer processor used in an industrial setting, such as a programmable logic controller (PLC), for controlling various components and sub-processors of the processing system. The memory, which may be coupled to the CPU, is non-transitory and is typically one or more of readily available memories such as random access memory (RAM), read only memory (ROM), floppy disk drive, hard disk, or any other form of digital storage, local or remote. The memory stores instructions that when executed by the CPU and/or the one or more processors included in the system controller 126 perform processes, such as the method 400 described below, in the processing chamber 100.

Typically, the memory is in the form of a non-transitory computer-readable storage media containing instructions (e.g., non-volatile memory), which when executed by the CPU, facilitates the operation of the processing chamber 100. The instructions in the memory are in the form of a program product such as a program that implements the methods of the present disclosure. The program code may conform to any one of a number of different programming languages. In one example, the disclosure may be implemented as a program product stored on computer-readable storage media for use with a computer system. The program (s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations.

Voltage Waveform Examples

Figure 2:
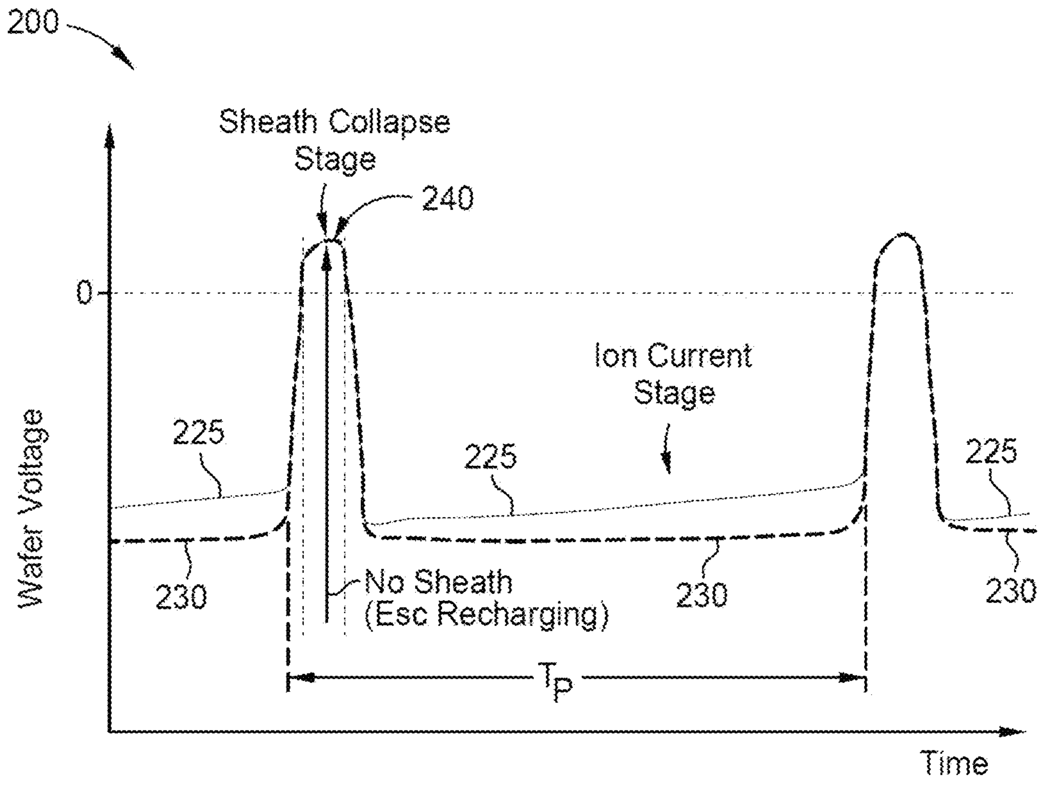
FIG. 2 illustrates a graph of two separate asymmetric voltage waveforms that are established on a substrate due to a voltage waveform applied to an electrode of a processing chamber, in accordance with certain embodiments of the present disclosure.

FIG. 2 illustrates a graph 200 of two separate asymmetric voltage waveforms established at the substrate 103 disposed on the substrate receiving surface 105A of the substrate support assembly 136 of the processing chamber 100 due to the delivery of PV waveforms to the bias electrode 104 of the processing chamber 100. A first waveform (e.g., a waveform 225) is an example of a non-compensated PV waveform established at the substrate 103 during the plasma processing. A second waveform (e.g., a waveform 230) is an example of a compensated PV waveform established at the substrate 103 by applying a negative slope waveform to the bias electrode 104 of the processing chamber 100 during an "ion current stage" portion of the PV waveform cycle by use of the current source 177. The compensated PV waveform can alternatively be established by applying a negative voltage ramp during the ion current stage of the PV waveform generated by the PV waveform generator 175. The PV waveform cycle of the waveforms 225, 230 each have a period $T_p$, which is, for example, typically between 2 microsecond (μs) and 10μs, such as 2.5 μs. The ion current stage of the PV waveform cycle will typically take up between about 50% and about 95% of the period $T_p$, such as from about 80% to about 90% of the period $T_p$.

The waveforms 225 and 230 include two main stages: an ion current stage and a sheath collapse stage. Both portions (e.g., the ion current stage and the sheath collapse stage) of the waveforms 225 and 230, can be alternately and/or separately established at the substrate 103 during the plasma processing. At a beginning of the ion current stage, a drop in the voltage at the substrate 103 is created, due to the delivery of a negative portion of the PV waveform (e.g., the ion current portion) provided to the bias electrode 104 by the PV waveform generator 175, which creates a high voltage sheath above the substrate 103. The high voltage sheath allows the plasma generated positive ions to be accelerated towards the biased substrate 103 during the ion current stage, and thus, for RIE processes, controls the amount and characteristics of the etching process that occurs on the surface of the substrate 103 during the plasma processing. The sheath collapse stage includes a positive voltage swing 240 (e.g., as a result of the positive wafer voltage), and the ion current stage includes a negative voltages swing (e.g., as a result of the positive wafer voltage), as illustrated in FIG. 2.

In some embodiments, it is desirable for the ion current stage to include a region of the PV waveform that achieves the voltage at the substrate 103 that is stable or minimally varying throughout the stage, as illustrated in FIG. 2 by the waveform 230. One will note that significant variations in the voltage established at the substrate 103 during the ion current stage, such as shown by the positive slope in the waveform 225, will undesirably cause a variation in the ion energy distribution (IED) and thus cause undesirable characteristics of the etched features to be formed in the substrate 103 during the RIE process. Plasma sheath impedance varies with supplied PV waveform voltages. The RF match 172 can use either or both of the synchronization signals and/or use its internal sensors to sample impedances in different processing phases. In one example, a synchronization signal or characteristics determined by the input sensor 116 or the output sensor 117 are used to trigger the RF match 172 to determine at least two different impendences at different processing stages. Then, the RF match 172 updates its matching point based on the at least two different impedances.

Bimodal IEDF-Containing Plasma Formation Examples

Figure 3A:
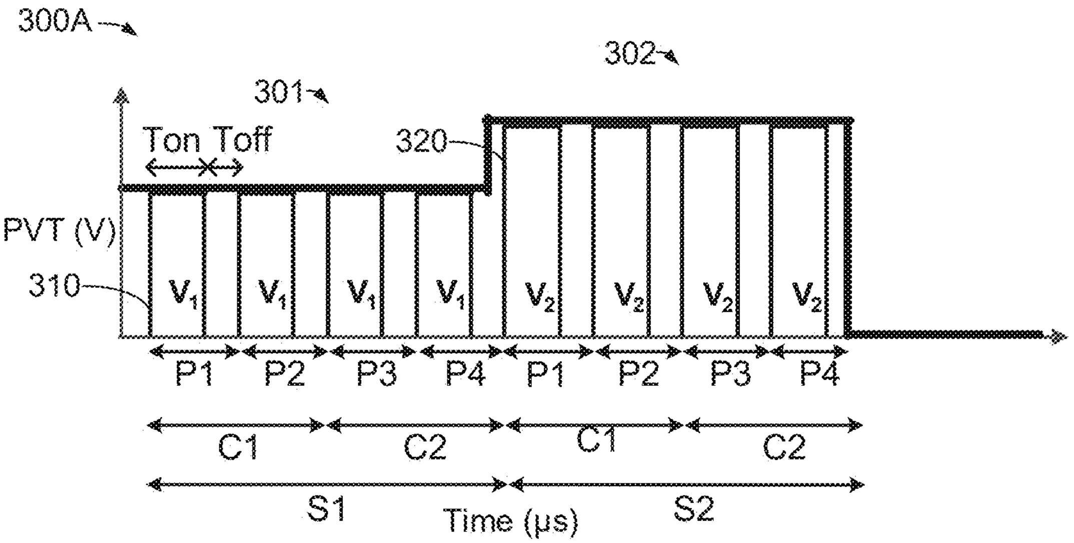
FIGS. 3A and 3B illustrates graphs of example pulse bursts of voltage pulses during pulsed voltage waveform generation, according to one or more of the embodiments described herein.
Figure 3B:
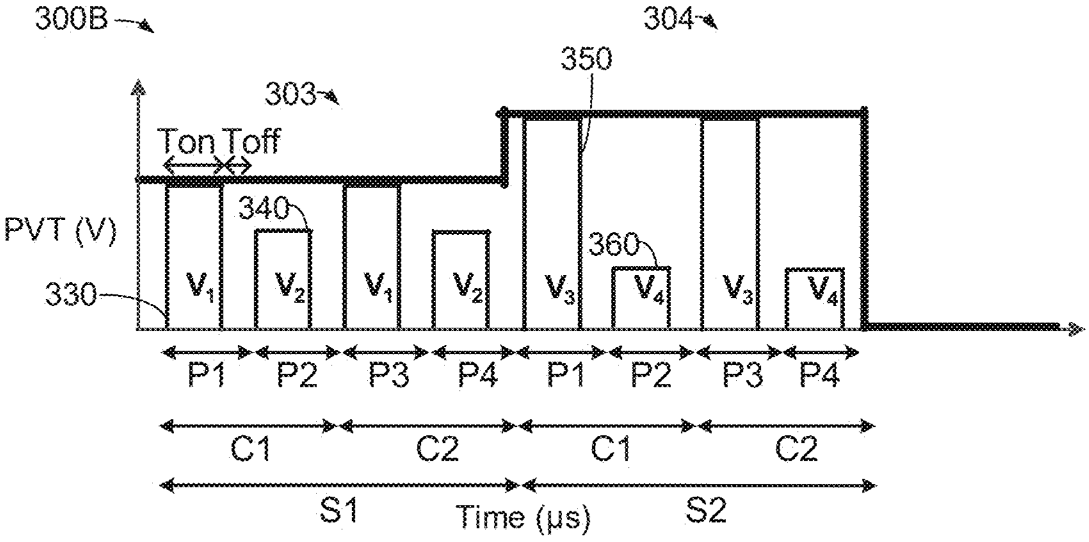

FIGS. 3A and 3B illustrates graphs 300A, 300B of example pulse bursts of voltage pulses during pulsed voltage waveform generation, according to one or more of the embodiments described herein. In the example, pulse bursts of graph 300A include a pulse burst 301 of a plurality of pulses 310 that are delivered by a pulser (e.g., PV waveform generator 175) during a first state S1 at a first voltage V1, and a pulse burst 302 of a plurality of pulses 320 that are delivered by the pulser during a second state S2 at a second voltage V2. The first voltage V1 may be different than the second voltage V2, as illustrated. It is to be understood that each pulse burst described herein may include any number of pulses, including a single pulse. For example, each pulse burst may include between 40 and 40,000 pulses. Each pulse burst may be considered and/or referred to as, for example, a pulse, a micro pulse, or a micro pulse burst. It is also to be understood that each pulse may be associated with any number of periods. The voltage pulses illustrated in FIGS. 3A-3B, as well as the voltage pulses of FIGS. 5-7 discussed below, schematically illustrate simplified representations of voltage pulses for ease of illustration and discussion purposes and can include more complex voltage pulses, such as the voltage pulses illustrated in FIG. 2.

Pulses 310 may be associated with periods P1, P2, P3, P4 of state S1, and pulses 320 may be associated with periods P1, P2, P3, P4 of state S2, as illustrated. Each period P1, P2, P3, P4 may include a $T_{on}$ portion (e.g., when the pulser delivering the pulses 310, 320 is on) and a $T_{off}$ portion (e.g., when the pulser delivering the pulses 310, 320 is off). Period P1 and P2 of state S1 may form cycle period C1 of state S1, period P3 and P4 may form cycle period C2 of state S1, period P1 and P2 of state S2 may form cycle period C1 of state S2, and period P3 and P4 may form cycle period C2 of state S2. In the graph 300A, each of the pulses 310 of state S1 may be at the same applied voltage V1, and each of the pulses 320 of state S2 may be at the same voltage V2. It should be noted that while FIGS. 3A-3B and 5-7 illustrate the applied voltage pulses as being in a positive direction, due to their position relative to the y-axis of the plots, one skilled in the art will appreciate that the bias applied to a substrate can have a positive or negative value relative to ground. In one example, each of the voltage pulses (e.g., pulses 310, 320, 330, 340, and/or 350 in FIGS. 3A-3B) include voltages that primarily have a negative bias relative to ground (e.g., voltage range between about 0 to about −8000 volts). As a result of the pulsed voltage (PV) pulsing scheme illustrated in graph 300A being used to provide direct current (DC) voltage bias in a plasma processing system, the resultant IEDF formed may be monoenergetic, as illustrated and described below with respect to FIG. 8A.

The graph 300B may be similar to the graph 300A, but may include states S1 and S2 with alternating voltage pulses within pulse bursts 303, 304 that are provided at different voltage levels. Specifically, state S1 may include pulses 330 at a first voltage V1 and pulses 340 at a second voltage V2, and state S2 may include pulses 350 at a third voltage V3 and pulses 360 at a fourth voltage V4. That is, the pulsing scheme of graph 300B may include pulses with alternating voltages in each state S1 and S2. As a result of the PV pulsing scheme illustrated in graph 300B being used to provide DC voltage bias to a substrate disposed in a plasma processing system, the resultant IEDF formed may be bimodal, as illustrated and described below with respect to FIG. 8B.

Embodiments of the present disclosure generally relate to apparatus and methods for controlling at least one of an ion energy or a total ion flux of an IEDF at a surface of a substrate processed in the plasma processing system by adjusting at least one of the magnitude of the applied voltage or the pulse-on-time (POT) (e.g., pulse width with respect to time of the applied voltage) of a plurality of pulses included in two or more pulse bursts used in the plasma processing system (e.g., to manipulate the ratio of the applied voltage and/or the POT of the plurality of pulses in one pulse burst of the two or more pulse bursts to the applied voltage and/or the POT of the plurality of pulses in another pulse burst of the two or more pulse bursts). In this manner, the plurality of pulses may be used to effectively form a customizable two peak (e.g., bimodal) IEDF-containing plasma that may be controlled and adaptable for various plasma-assisted processes in the plasma processing system.

For example, by increasing the voltage of the plurality of pulses in one pulse burst of the two or more pulse bursts and thereby increasing the ratio of the voltage of the pulses in the two or more pulse bursts, the ion energy of the higher peak (e.g., curve 830 in FIG. 8B) of the bimodal IEDF-containing plasma is increased (e.g., as shown by corresponding curve 850 in FIG. 8C, which is described below). When the voltage of the plurality of pulses in one pulse burst of the two or more pulse bursts is decreased, the ratio of the voltage of the pulses in the two or more pulse bursts is decreased and the ion energy of the lower peak (e.g., curve 820 in FIG. 8B) of the bimodal IEDF-containing plasma is decreased (not shown). In another example, by increasing the POT of the plurality of pulses in one pulse burst of the two or more pulse bursts and thereby increasing the ratio of the POT between the plurality of pulses in the two or more pulse bursts, the IEDF of the bimodal IEDF-containing plasma is increased (e.g., as shown by curves 860 and 870 in FIG. 8D, which is also described below). When the POT of the plurality of pulses in one pulse burst of the two or more pulse bursts is decreased, the ratio of the POT of the pulses in the two or more pulse bursts is decreased and the IEDF of the two peak bimodal IEDF-containing plasma is decreased.

Figure 4:
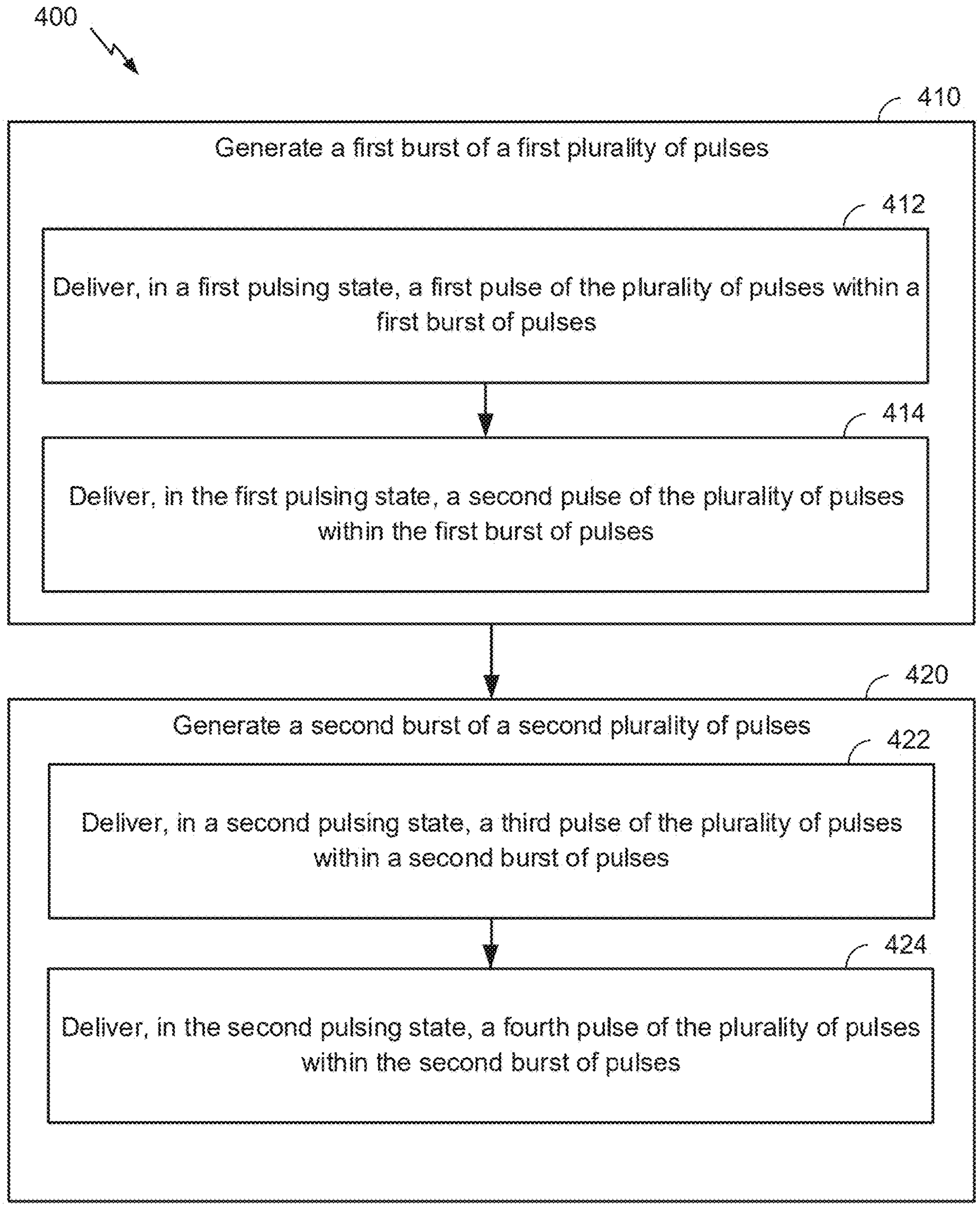
FIG. 4 is a flow diagram illustrating a method of forming a bimodal ion energy distribution function (IEDF)-containing plasma, according to one or more of the embodiments described herein.
Figure 5:
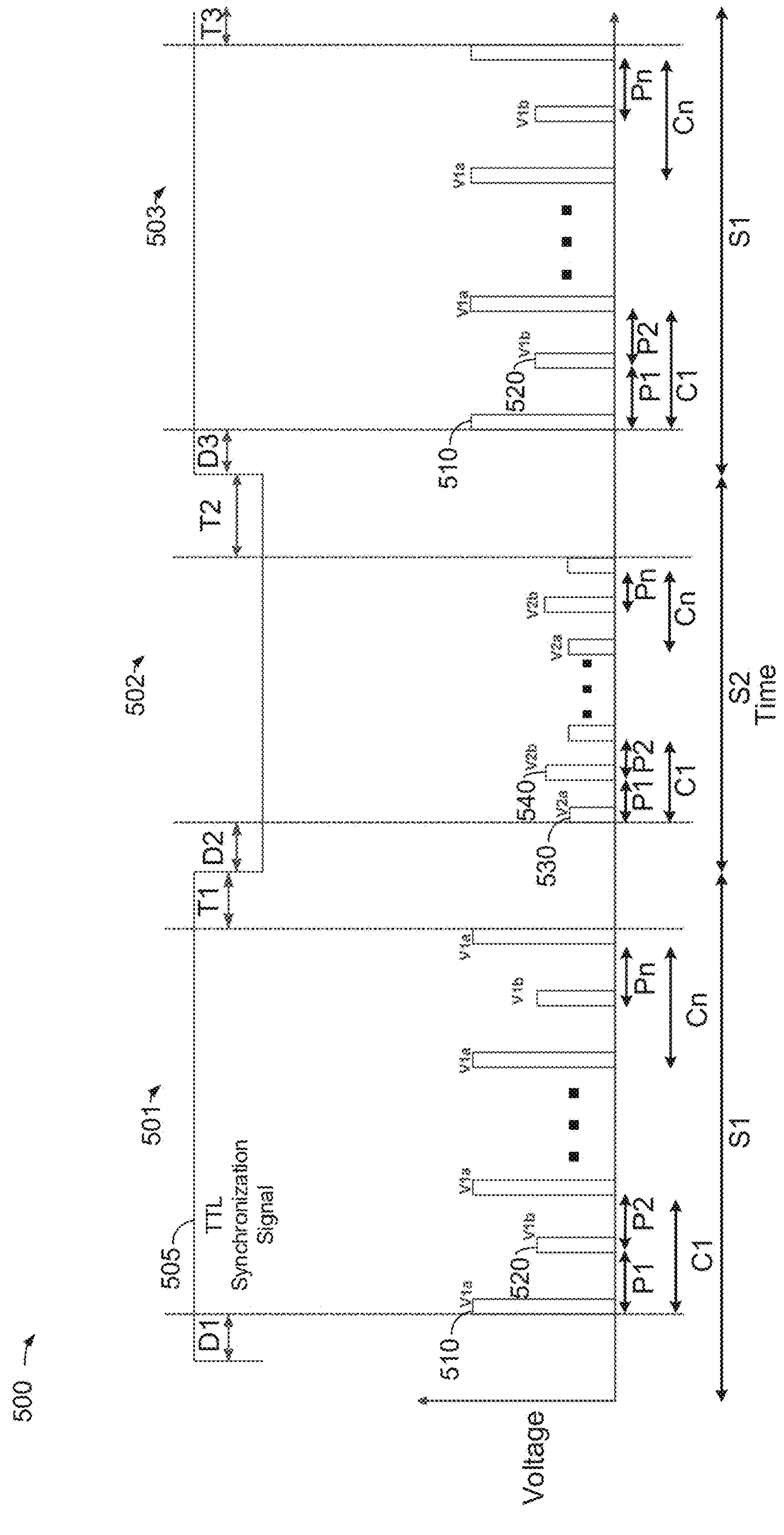
FIGS. 5-7 are graphs of example pulsing schemes used to generate a waveform during the method of forming a bimodal IEDF-containing plasma of FIG. 4, according to one or more of the embodiments described herein.
Figure 6A:
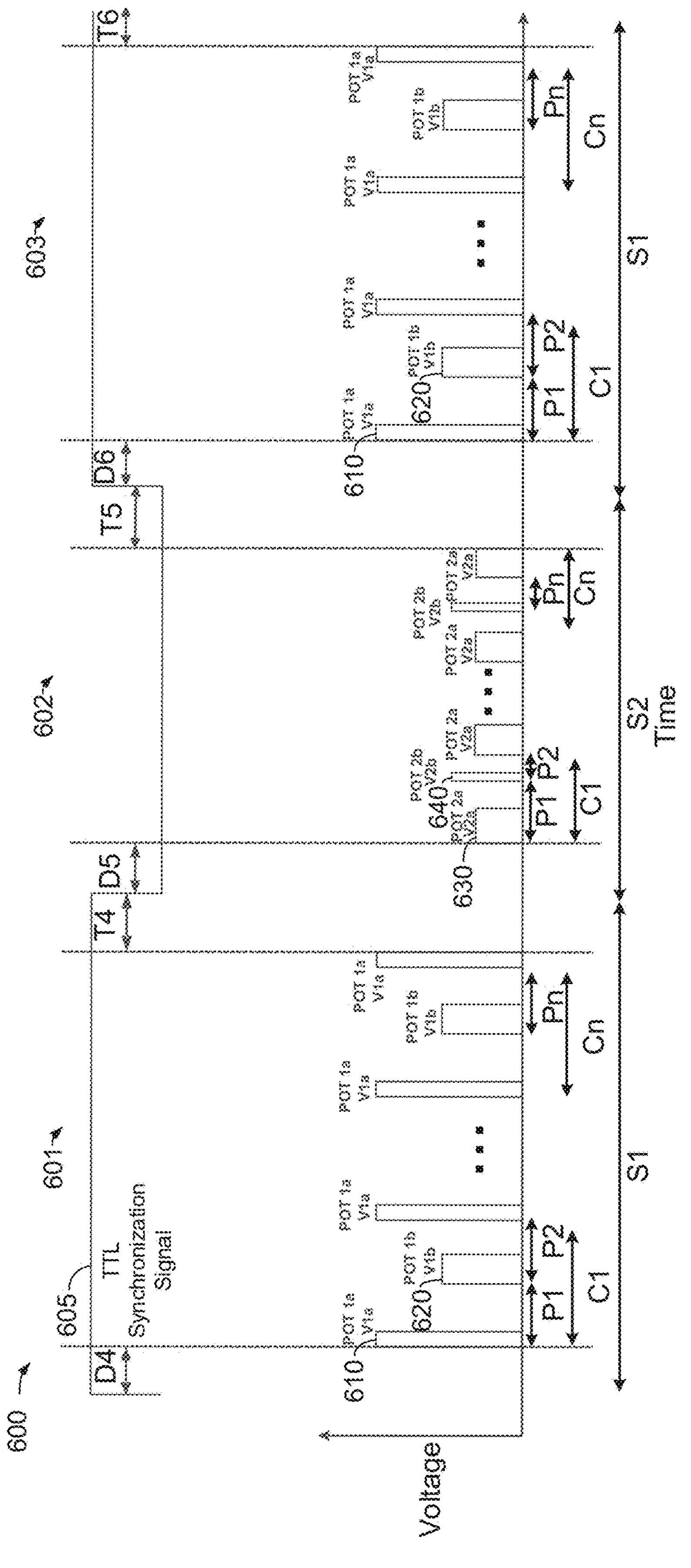

FIG. 4 is a flow diagram illustrating a method 400 of forming a bimodal IEDF-containing plasma, according to one or more of the embodiments described herein. FIGS. 5-7 are graphs of example pulsing schemes 500, 600, 700, used to generate a waveform during the method 400 of forming a bimodal IEDF-containing plasma of FIG. 4, according to one or more of the embodiments described herein. Therefore, FIGS. 4 and 5-7 are herein described together for clarity. It is to be understood that FIGS. 5-7 are merely examples, and that any number of voltage pulses and pulse bursts at any voltage level and with any POT may be utilized in the method 400. It is also to be understood that the pulsing states S1 and S2 described herein may be repeated any number of times to provide DC voltage bias in a plasma processing system.

The method 400 includes, at block 410, generating a first burst of a first plurality of pulses. For example, block 410 may include generating pulse burst 501, which includes pulses 510 and 520, as illustrated in FIG. 5. In another example, block 410 may include generating pulse burst 601, which includes pulses 610 and 620, as illustrated in FIG. 6A. In yet another example, block 410 may include generating pulse burst 701, which includes pulses 710, 712, 720, 722, and 724, as illustrated in FIG. 7. The pulses described herein may form part of a PV waveform that may be used for DC voltage biasing in a plasma processing system (e.g., plasma processing system 10).

Generating the first burst of the first plurality of pulses at block 410 includes, at block 412, delivering, in a first pulsing state S1, a first pulse of the plurality of pulses for a first portion (e.g., during a $T_{on}$ portion when the pulser is turned on) of a first period P1 of state S1 at a first voltage using a pulser (e.g., PV waveform generator 175). For example, pulses 510, 610, 710 of pulsing schemes 500, 600, and 700, respectively, may be delivered at voltage V1*a* in state S1 for the $T_{on}$ portion of the first period P1 of state S1. Block 412 also includes halting the delivery of the first pulse for a second portion (e.g., during a $T_{off}$ portion when the pulser is turned off) of the first period P1 of state S1. For example, pulses 510, 610, 710 of pulsing schemes 500, 600, and 700, respectively, may be halted for the $T_{off}$ portion of the first period P1 of state S1.

Generating the first burst of the first plurality of pulses at block 410 includes, at block 414, delivering, in the first pulsing state S1, a second pulse of the plurality of pulses for a first portion (e.g., during a $T_{on}$ portion when the pulser is turned on) of a second period P2 of pulsing state S1 at a second voltage using the pulser. For example, pulses 520, 620, 720 of pulsing schemes 500, 600, and 700, respectively, may be delivered at voltage V1*b* in state S1 for the $T_{on}$ portion of the second period P2 of state S1. Block 414 also includes halting the delivery of the second pulse for a second portion (e.g., during a $T_{off}$ portion when the pulser is turned off) of the second period P2 of state S1. For example, pulses 520, 620, 720 of pulsing schemes 500, 600, and 700, respectively, may be halted for the $T_{off}$ portion of the second period P2 of state S1. Voltage V1*a* may be the same as, larger than, or smaller than voltage V1*b*.

The method 400 includes, at block 420, generating a second burst of a second plurality of pulses. For example, block 420 may include generating pulse burst 502, which includes pulses 530 and 540, as illustrated in FIG. 5. In another example, block 420 may include generating pulse burst 602, which includes pulses 630 and 640, as illustrated in FIG. 6A. In yet another example, block 420 may include generating pulse burst 702, which includes pulses 730, 740, 742, 744, and 746, as illustrated in FIG. 7. It is to be understood that FIGS. 5, 6, and 7 are merely examples, and that any combination of pulses bursts (each including any number of pulses) may be generated during the method 400.

Generating the second burst of the second plurality of pulses at block 420 includes, at block 422, delivering, in a second pulsing state, a third pulse of the plurality of pulses for a first portion (e.g., during a $T_{on}$ portion when the pulser is turned on) of a first period P1 of pulsing state S2 at a third voltage using the pulser. For example, pulses 530, 630, 730 of pulsing schemes 500, 600, and 700, respectively, may be delivered at voltage V2*a* in state S2 for the $T_{on}$ portion of the first period P1 of state S2. Block 422 also includes halting the delivery of the third pulse for a second portion (e.g., during a $T_{off}$ portion when the pulser is turned off) of the first period P1 of pulsing state S2. For example, pulses 530, 630, 730 of pulsing schemes 500, 600, and 700, respectively, may be halted for the $T_{off}$ portion of the first period P1 of pulsing state S2.

Generating the second burst of the second plurality of pulses at block 420 includes, at block 424, delivering, in the second pulsing state S2, a fourth pulse of the plurality of pulses for a first portion (e.g., during a $T_{on}$ portion when the pulser is turned on) of a second period P2 of state S2 at a fourth voltage using the pulser. For example, pulses 540, 640, 740 of pulsing schemes 500, 600, and 700, respectively, may be delivered at voltage V2*b* in state S2 for the $T_{on}$ portion of the second period P2 of state S2. Block 424 also includes halting the delivery of the fourth pulse for a second portion (e.g., during a $T_{off}$ portion when the pulser is turned off) of the second period P2 of state S2. For example, pulses 540, 640, 740 of pulsing schemes 500, 600, and 700, respectively, may be halted for the $T_{off}$ portion of the second period P2 of state S2. The first voltage V1*a*, the second voltage V1*b*, the third voltage V2*a*, and the fourth voltage V1*b* may each different. In one example, voltage V2*a* may be the same as, larger than, or smaller than voltage V2*b*. Each of the first pulse, the second pulse, the third pulse, and the fourth pulse, as well as the other pulses described herein, may have a voltage, a period, and a POT.

In some embodiments, state S1 may follow state S2, period P2 of state S1 may follow period P1 of state S1, period P1 of state S2 may follow period P2 of state 1, and period P2 of state S2 may follow period P1 of state S2, as illustrated in the pulsing schemes 500, 600 of FIGS. 5 and 6A. Periods P1 and P2 of state S1 may form a cycle period C1 of state S1, and period P1 and P2 of state S2 may form a cycle period C1 of state S2, as illustrated in FIGS. 5 and 6A. State S1 and/or state S2 may each include any number of cycle periods $C_n$ (where n represents the cycle period number, which is an integer greater than 1, within the state). In addition, any number of periods $P_n$ (where n period number, which is an integer greater than 1, within each state).

According to certain embodiments, generating the plurality of pulses at block 410 may further include delaying (e.g., using a timer included in the plasma processing system) the delivering of a pulse burst (or one or more pulses of the pulse burst) for a sub-period of time after a synchronization signal (e.g., a transistor-transistor logic (TTL) synchronization signal 505, 605, 705, as illustrated in FIGS. 5-7, respectively) is delivered. The delay sub-period of time may be D1, D2, and D3 illustrated in FIG. 5, delay D4, D5, and D6 illustrated in FIG. 6A, and/or delay D7, D8, and D9 illustrated in FIG. 7. For example, the delivery of pulse 510 in pulse burst 501, pulse 610 in pulse burst 601, and pulse 710 in pulse burst 701 may be delayed after the delivery of the synchronization signal by delay sub-period of time D1, D4, and D7, respectively. In another example, the delivery of pulse 530 in pulse burst 502, pulse 630 in pulse burst 602, and pulse 740 in pulse burst 702 may be delayed after the delivery of the synchronization signal by delay sub-period of time D2, D5, and D8, respectively. In yet another example, the delivery of pulse 510 in pulse burst 503, pulse 610 in pulse burst 603, and pulse 710 in pulse burst 703 may be delayed after the delivery of the synchronization signal by delay sub-period of time D3, D6, and D9, respectively. In this manner, the pulses may be delayed and the resultant IEDF in the IEDF-containing plasma may be further customized with respect to the synchronization signal based on the desired plasma-assisted process. For example, when the edge of the TTL synchronization signal is detected, the pulser may delay delivering the pulses for the sub-period of time. The sub-period of time associated with the delay may be, for example, between 1 millisecond and 1 second. In one example, the sub-period of time associated with the delay may be 100 milliseconds.

According to certain embodiments, generating the plurality of pulses at block 410 may further include halting the delivery (e.g., using a timer included in the plasma processing system) of a pulse burst (or one or more pulses of a pulse burst) for a sub-period of time while the synchronization signal is delivered and before the termination of the synchronization signal. The sub-period of time may be time T1, T2, and T3 illustrated in FIG. 5, time T4, T5, and T6 illustrated in FIG. 6A, and/or time T7, T8, and T9 illustrated in FIG. 7. For example, the delivery of pulse 510 in pulse burst 501, pulse 610 in pulse burst 601, and pulse 710 in pulse burst 701 may be halted before the termination of the synchronization signal by sub-period of time T1, T4, and T7, respectively. In another example, the delivery of pulse 530 in pulse burst 502, pulse 630 in pulse burst 602, and pulse 740 in pulse burst 702 may be halted before the termination of the synchronization signal by sub-period of time T2, T5, and T8, respectively. In yet another example, the delivery of pulse 510 in pulse burst 503, pulse 610 in pulse burst 603, and pulse 710 in pulse burst 703 may be halted before the termination of the synchronization signal by delayed by sub-period of time T3, T6, and T9, respectively. In this manner, the pulses may be halted early and the resultant IEDF in the IEDF-containing plasma may be further customized with respect to the synchronization signal based on the desired plasma-assisted process. The sub-period of time associated with the halting may be, for example, between 1 millisecond and 1 second. In one example, the sub-period of time associated with the halting may be 100 milliseconds. In some cases, the sub-period of time associated with the delay and the sub-period of time associated with the halting may together be, for example, between 1 millisecond and 1 second. In one example, the sub-period of time associated with the delay and the sub-period of time associated with the halting may together be 100 milliseconds.

In some embodiments, the POT of the first pulse and the POT of the second pulse may be the same, as illustrated in FIG. 5. The POT of the third pulse and the POT of the fourth pulse may, in some embodiments, be the same. In some cases, the POT of the first pulse, the POT of the second pulse, the POT of the third pulse, and the POT of the fourth pulse may the same, also as illustrated in FIG. 5.

Figure 6B:
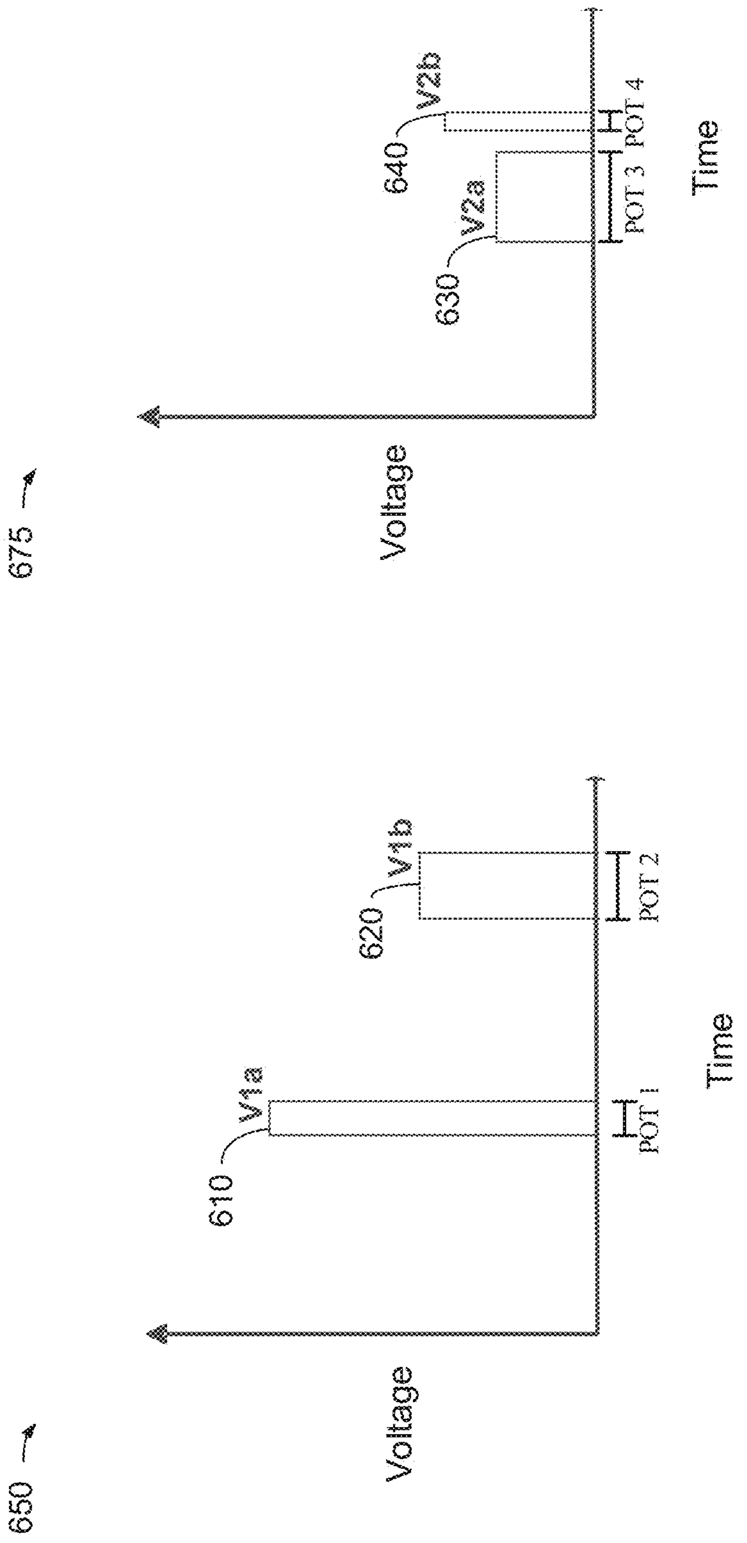
Figure 7:
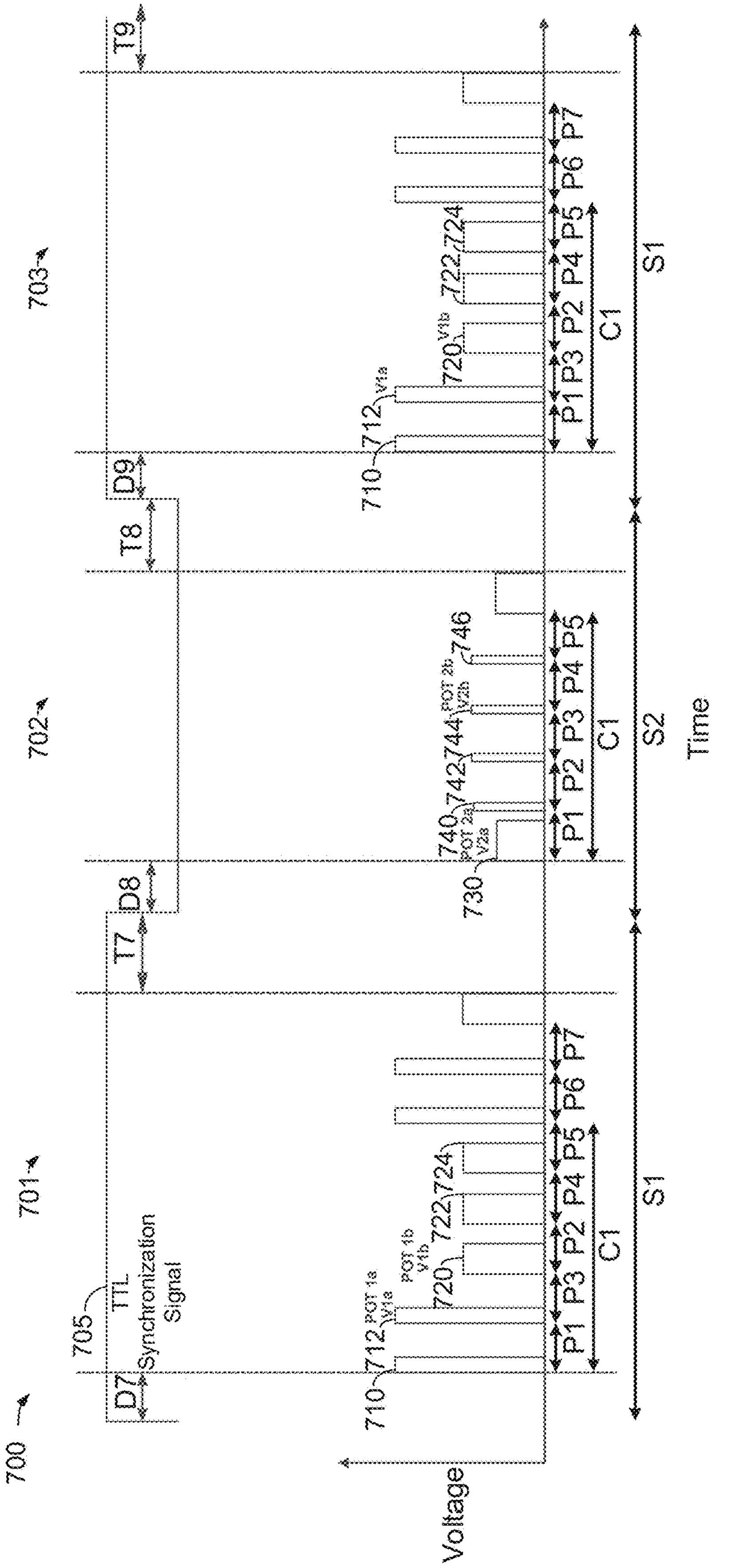

However, in some embodiments, the POT of the first pulse (e.g., POT 1a) may be different than the POT of the second pulse (e.g., POT 1b), as illustrated in FIGS. 6A and 6B. The POT of the third pulse (e.g., POT 2a) may, in some embodiments, be different than the POT of the fourth pulse (e.g., POT 2b), also as illustrated in FIGS. 6A and 6B. In some cases, the POT of the first pulse, the POT of the second pulse, the POT of the third pulse, and the POT of the fourth pulse may each be different. For example, and as illustrated in graphs 650 and 675 of FIG. 6B, the POT of pulse 610 (labeled "POT 1") may be smaller than the POT of pulse 620 (labeled "POT 2"), and the POT of pulse 630 (labeled "POT 3") may be larger than the POT of pulse 640 (labeled "POT 4"). It is to be understood that the POT of any of the pulses described herein may be larger, smaller, or the same as the POT of any other pulse.

According to certain embodiments, generating the first burst of the first plurality of pulses at block 410 may further include delivering, in the first pulsing state S1, a fifth pulse of the plurality of pulses for a first portion (e.g., during a $T_{on}$ portion when the pulser is turned on) of a third period P3 of pulsing state S1 at the first voltage using the pulser, and then halting the delivery of the fifth pulse for a second portion (e.g., during a $T_{off}$ portion when the pulser is turned off) of the third period P3 of pulsing state S1. For example, pulse 712 of pulsing scheme 700 in FIG. 7 may be delivered at voltage V1*a* for the $T_{on}$ portion of the third period P3 of state S1 and then halted for the $T_{off}$ portion of the third period P3 of state S1. Pulse 712 may follow pulse 710, as illustrated in FIG. 7.

In these embodiments, generating the first burst of the first plurality of pulses at block 410 may further include delivering, in the first pulsing state, a sixth pulse of the plurality of pulses for a first portion (e.g., during a $T_{on}$ portion when the pulser is turned on) of a fourth period P4 of pulsing state S1 at the second voltage using the pulser, and then halting the delivery of the sixth pulse for a second portion (e.g., during a $T_{off}$ portion when the pulser is turned off) of the fourth period P4 of pulsing state S1. For example, pulse 722 of pulsing scheme 700 in FIG. 7 may be delivered at voltage V1*b* for the $T_{on}$ portion of the fourth period P4 of state S1 and then halted for the $T_{off}$ portion of the fourth period P4 of state S1.

In these embodiments, generating the plurality of pulses at block 410 may further include delivering, in the first pulsing state, a seventh pulse of the plurality of pulse for a first portion (e.g., during a $T_{on}$ portion when the pulser is turned on) of a fifth period P5 of pulsing state S1 at the second voltage using the pulser, and then halting the delivery of the seventh pulse for a second portion (e.g., during a $T_{off}$ portion when the pulser is turned off) of the fifth period P5 of pulsing state S1. For example, pulse 724 of pulsing scheme 700 in FIG. 7 may be delivered at voltage V1*b* for the $T_{on}$ portion of the fifth period P5 of state S1 and then halted for the $T_{off}$ portion of the fifth period P5 of state S1.

In this manner, the pulsing scheme 700 of FIG. 7 may include two pulses 710, 712 at voltage V1*a* (with POT 1a) and three pulses 720, 722, 724 at voltage V1*b* (with POT 1b) during pulsing state S1. The pulsing scheme 700 may also include one pulse 730 at a voltage V2*a* (with POT 2a) and four pulses 740, 742, 744, 746 at voltage V2*b* (with POT 2b) during pulsing state S2. POT 1a, POT 1b, POT 2a, and POT 2b may each be the same, different (as illustrated), or some of the POTs may be the same and some may be different, as described above. By varying the pulsing scheme (e.g., the number of pulses of the plurality of pulses) while adjusting the voltage level and/or the POT of the plurality of pulse bursts, the time scale of the pulsing scheme may be varied and enhanced control of the IEDF (and of the ion energy and/or the total ion flux of the IEDF) may be achieved.

In some embodiments, period P3 of state S1 follows period P1 of state S1, period P2 of state S1 follows period P3 of state S1, period P4 of state S1 follows period P2 of state S1, and period P5 of state S1 follows period P4 of state S1, as illustrated in the pulsing scheme 700 of FIG. 7. Periods P1, P3, P2, P4, P5, P6, and P7 of state S1 may form cycle period C1 of state S1, as illustrated in FIG. 7. Pulses 710 and 712 from periods P1 and P2 may be repeated in periods P6 and P7 of state S1, as illustrated. It is to be understood that state S1 and state S2 may each include any number of cycle periods.

According to certain embodiments, generating the second burst of the second plurality of pulses at block 420 may further include delivering, in the second pulsing state, an eighth pulse of the plurality of pulses for a first portion (e.g., during a $T_{on}$ portion when the pulser is turned on) of a third period P3 of pulsing state S2 at the fourth voltage using the pulser, and then halting the delivery of the eighth pulse for a second portion (e.g., during a $T_{off}$ portion when the pulser is turned off) of the third period P3 of pulsing state S2. For example, pulse 742 of pulsing scheme 700 in FIG. 7 may be delivered at voltage V2*b* for the $T_{on}$ portion of the third period P3 of pulsing state S2 and then halted for the $T_{off}$ portion of the third period P3 of pulsing state S2.

According to certain embodiments, generating the second burst of the second plurality of pulses at block 420 may further include delivering, in the second pulsing state, a ninth pulse of the plurality of pulse for a first portion (e.g., during a $T_{on}$ portion when the pulser is turned on) of a fourth period P4 of pulsing state S2 at the fourth voltage using the pulser and then halting the delivery of the ninth pulse for a second portion (e.g., during a $T_{off}$ portion when the pulser is turned off) of the fourth period P4 of pulsing state S2. For example, pulse 744 of pulsing scheme 700 in FIG. 7 may be delivered at voltage V2*b* for the $T_{on}$ portion of the fourth period P4 of pulsing state S2 and then halted for the $T_{off}$ portion of the fourth period P4 of pulsing state S2.

According to certain embodiments, generating the second burst of the second plurality of pulses at block 420 may further include delivering, in the second pulsing state, a tenth pulse of the plurality of pulse for a first portion (e.g., during a $T_{on}$ portion when the pulser is turned on) of a fifth period P5 of pulsing state S2 at the fourth voltage using the pulser and then halting the delivery of the tenth pulse for a second portion (e.g., during a $T_{off}$ portion when the pulser is turned off) of the fifth period P5. For example, pulse 746 of pulsing scheme 700 in FIG. 7 may be delivered at voltage V2*b* for the $T_{on}$ portion of the fifth period P5 of pulsing state S2 and then halted for the $T_{off}$ portion of the fifth period P5 of pulsing state S2.

In some embodiments, period P2 of state S2 follows period P1 of state S2, period P3 of state S2 follows period P2 of state S2, period P4 of state S2 follows period P3 of state S2, and period P5 of state S2 follows period P4 of state S2, as illustrated in the pulsing scheme 700 of FIG. 7.

In some embodiments, the method 400 and the operations described herein may be performed by a system controller (e.g., the system controller 126 of FIG. 1). The system controller may include memory that includes computer-executable instructions and one or more processors configured, individually or collectively, to execute the computer-executable instructions and cause a waveform generator (e.g., a waveform generator that includes the RF generator 171 and the PV waveform generator 175) to perform the method 400 and any other operations described herein.

FIGS. 8A-D illustrate graphs of example time-averaged IEDFs 800A, 800B, 800C, 800D during the method 400 of forming a bimodal IEDF-containing plasma of FIG. 4, according to one or more of the embodiments described herein.

Figure 8A:
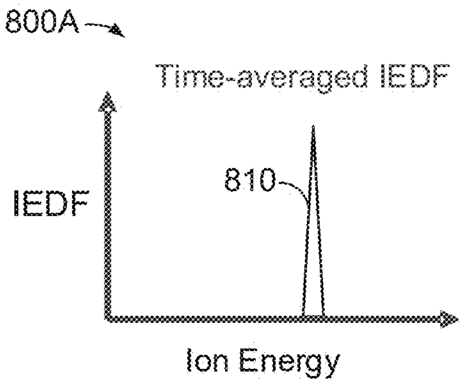
FIGS. 8A-D illustrate graphs of example time-averaged IEDFs during the method of forming a bimodal IEDF-containing plasma of FIG. 4, according to one or more of the embodiments described herein.

The time-averaged IEDF 800A of FIG. 8A includes a single time-averaged IEDF curve 810, and is therefore monoenergetic. The IEDF 800A may correspond to a pulsing scheme where each pulsing state includes a plurality of pulses that are applied at the same voltage, which forms the monoenergetic IEDF as illustrated in FIG. 8A.

Figure 8B:
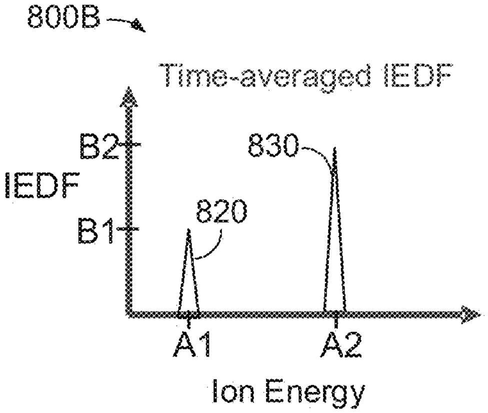
Figure 8C:
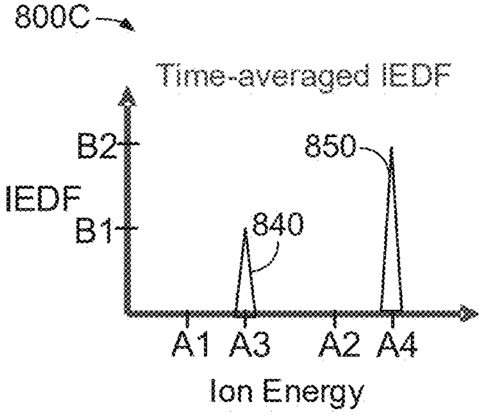
Figure 8D:
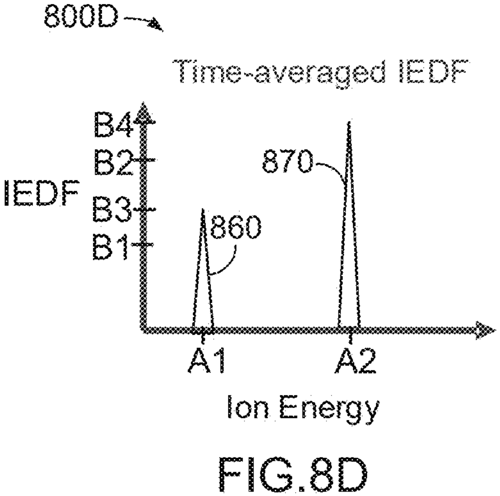

The time-averaged IEDF 800B of FIG. 8B includes two time-averaged IEDF curves 820, 830, and therefore includes a bimodal distribution of IEDF peaks. Time-averaged IEDF curves 820, 830 may have an ion energy A1 and A2 (e.g., position on the X-axis), respectively, and an IEDF magnitude B1 and B2 (e.g., height on the Y-axis), respectively, as illustrated. The IEDF 800B may correspond to a pulsing scheme where each pulsing state includes pulses that are applied at two different applied voltage levels, which forms the bimodal IEDF, as illustrated in FIG. 8B. In one example, and as shown in FIG. 3B, the pulses 330 and 340 within a first burst of pulses are applied at two different applied voltage levels to achieve a first bimodal IEDF distribution during pulsing state S1, and the pulses 350 and 360 within a second burst of pulses are applied at two different applied voltage levels to achieve a second bimodal IEDF distribution during pulsing state S2.

In some embodiments, the ion energy and/or the total ion flux of the IEDF may be controlled by adjusting at least one of the applied voltage or the POT of the plurality of pulses in at least one of a plurality of pulse bursts (e.g., to manipulate the ratio of the applied voltage and/or the POT of the plurality of pulses in one pulse burst of the plurality of pulse bursts to the applied voltage and/or the POT of the plurality of pulses in another pulse burst of the plurality of pulse bursts). In some cases, and as illustrated in FIG. 5, the voltage level of pulses 510 and the voltage level of pulses 520 of state S1 may be different, and the voltage level of pulses 530 and the voltage level of pulses 540 of state S2 may also be different. Increasing the applied voltage level of pulses 510, the voltage level of pulses 520, the voltage level of pulses 530, and/or the voltage level of pulses 540 results in an increase in ion energy for the resultant bimodal IEDF. The time-averaged IEDF 800C of FIG. 8C includes two time-averaged IEDF curves 840, 850. Time time-averaged IEDF 800C may be similar to FIG. 8B, but the respective ion energy A3 and A4 of the time-averaged IEDF curves 840, 850 may be shifted to the right (compared to the IEDF curves 820, 830 of FIG. 8B) as a result of increasing the voltage level of the pulses associated with the creation of the time-averaged IEDF curves 840, 850. In other cases, decreasing the voltage level of pulses 510, the voltage level of pulses 520, the voltage level of pulses 530, and/or the voltage level of pulses 540 results in a decrease in ion energy for the resultant bimodal IEDF and thus shifting the IEDF peaks to the left relative to the to the IEDF curves 820, 830 of FIG. 8B.

In some cases, and as illustrated in FIG. 5, the POT of pulses 510 and the POT of pulses 520 of state S1 may be different, and the POT of pulses 530 and the POT of pulses 540 of state S2 may also be different. Increasing the POT of pulses 510, the POT of pulses 520, the POT of pulses 530, and/or the POT of pulses 540 results in an increase in the number of ions or the intensity of the resultant bimodal IEDF. That is, the POT of the pulses can be used to control and determine the cumulative flux of the resultant bimodal IEDF. The time-averaged IEDF 800D of FIG. 8D includes two time-averaged IEDF curves 860, 870. Time time-averaged IEDF 800D may be similar to FIG. 8B, but the magnitude of the IEDF peaks B3 and B4 of the time-averaged IEDF curves 860, 870, respectively, may be higher as a result of increasing the POT of the pulses associated with the time-averaged IEDF curves 860, 870 (compared to the IEDF peaks B1 and B2 of the IDEF curves 820, 830 of FIG. 8B). In this manner, the number of ions bombarding the surface of a substrate is increased when the POT of a pulse is increased. In other cases, decreasing the POT of pulses 510, the POT of pulses 520, the POT of pulses 530, and/or the POT of pulses 540 results in a decrease in the number of ions or the intensity for the resultant IEDF peaks of the bimodal IEDF distribution (not illustrated).

In accordance with certain aspects of the present disclosure, the ion energy and/or the total ion flux of the IEDF may be controlled by adjusting at least one of the voltage or the POT of pulses within each of the plurality of pulse bursts, by manipulating the number of pulses within two or more of the plurality of pulsed bursts (e.g., to manipulate the ratio of the voltage and/or the POT of the plurality of pulses in one pulse burst of the two or more pulse bursts to the applied voltage and/or the POT of the plurality of pulses in another pulse burst of the two or more pulse bursts). In this manner, the two or more pulse bursts may be used to effectively form discrete bimodal IEDF-containing plasma that is customizable for various plasma-assisted processes in the plasma processing system.

Additional Considerations

In the above description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the term "about" may refer to a +/−10% variation from the nominal value. It is to be understood that such a variation can be included in any value provided herein.

As used herein, "a processor," "at least one processor" or "one or more processors" generally refers to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory" or "one or more memories" generally refers to a single memory configured to store data and/or instructions, multiple memories configured to collectively store data and/or instructions.

As used herein, a phrase referring to "at least one of" or "one or more of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

While the foregoing is directed to embodiments of the present disclosure, other and further embodiments of the disclosure may be devised without departing from the basic scope thereof, and the scope thereof is determined by the claims that follow.

We claim:

1. A method of forming a discrete multimodal ion energy distribution function (IEDF)-containing plasma, the method comprising:

generating a first burst of a first plurality of pulses, wherein generating the first burst of the first plurality of pulses comprises:

delivering, in a first pulsing state, a first pulse of the first plurality of pulses within a first burst of pulses, wherein the first pulse comprises a first voltage, a first period, and a first pulse-on-time (POT) within the first period;

delaying the delivering of the first burst of the first plurality of pulses for a sub-period of time after the delivery of a synchronization signal; and delivering, in the first pulsing state, a second pulse of the first plurality of pulses within the first burst of pulses, wherein the second pulse comprises a second voltage, a second period, and a second POT within the second period; and generating a second burst of a second plurality of pulses, wherein generating the second burst of the second plurality of pulses comprises:

delivering, in a second pulsing state, a third pulse of the second plurality of pulses within a second burst of pulses, wherein the third pulse comprises a third voltage, a third period, and a third POT within the third period; and delivering, in the second pulsing state, a fourth pulse of the second plurality of pulses within the second burst of pulses, wherein the fourth pulse comprises a fourth voltage, a fourth period, and a fourth POT within the third period, and wherein the first voltage, the second voltage, the third voltage, and the fourth voltage are each different.

2. The method of claim 1, wherein the second period follows the first period, wherein the third period follows the second period, and wherein the fourth period follows the third period.

3. The method of claim 1, wherein the POT of the first pulse and the POT of the second pulse are different.

4. The method of claim 3, wherein the POT of the third pulse and the POT of the fourth pulse are different.

5. The method of claim 1, further comprising:

repeating the generation of the first burst of the first plurality of pulses at least once, wherein during the repeated generation of the first burst of the first plurality of pulses, at least one of the first voltage, the first period, or the first POT within the first period are changed.

6. The method of claim 1, wherein the POT of the first pulse is different than the POT of the second pulse, or the POT of the third pulse is different than the POT of the fourth pulse.

7. The method of claim 1, wherein generating the first burst of the first plurality of pulses further comprises:

delivering, in the first pulsing state, a fifth pulse of the first plurality of pulses within the first burst of pulses, wherein the fifth pulse comprises a fifth voltage, a fifth period, and a fifth POT within the fifth period;

delivering, in the first pulsing state, a sixth pulse of the first plurality of pulses within the first burst of pulses, wherein the sixth pulse comprises a sixth voltage, a sixth period, and a sixth POT within the sixth period; and delivering, in the first pulsing state, a seventh pulse of the first plurality of pulses within the first burst of pulses, wherein the seventh pulse comprises a seventh voltage, a seventh period, and a seventh POT within the seventh period.

8. The method of claim 7, wherein the fifth period follows the first period, wherein the second period follows the fifth period, wherein the sixth period follows the second period, and wherein the seventh period follows the sixth period.

9. The method of claim 7, wherein generating the second burst of the second plurality of pulses further comprises:

delivering, in the second pulsing state, an eighth pulse of the second plurality of pulses within the second burst of pulses, wherein the eighth pulse comprises an eighth voltage, an eighth period, and an eighth POT within the eighth period;

delivering, in the second pulsing state, a ninth pulse of the second plurality of pulses within the second burst of pulses, wherein the ninth pulse comprises a ninth voltage, a ninth period, and a ninth POT within the ninth period; and delivering, in the second pulsing state, a tenth pulse of the second plurality of pulses within the second burst of pulses, wherein the tenth pulse comprises a tenth voltage, a tenth period, and a tenth POT within the tenth period.

10. The method of claim 9, wherein the fifth period follows the first period of the first pulsing state, wherein the second period follows the fifth period, wherein the sixth period follows the second period, wherein the seventh period follows the sixth period, wherein the eighth period follows the seventh period, wherein the third period follows the eighth period, wherein the fourth period follows the third period, wherein the eighth period follows the fourth period, wherein the ninth period follows the eighth period, and wherein the tenth period follows the ninth period.

11. A method of forming a discrete multimodal ion energy distribution function (IEDF)-containing plasma, the method comprising:

generating a first burst of a first plurality of pulses, wherein generating the first burst of the first plurality of pulses comprises:

delivering, in a first pulsing state, a first pulse of the first plurality of pulses within a first burst of pulses, wherein the first pulse comprises a first voltage, a first period, and a first pulse-on-time (POT) within the first period; and delivering, in the first pulsing state, a second pulse of the first plurality of pulses within the first burst of pulses, wherein the second pulse comprises a second voltage, a second period, and a second POT within the second period, wherein the generating of the first pulse burst is delayed for a first sub-period of time after the delivery of a synchronization signal and the generating of the first pulse burst is halted for a second sub-period; and generating a second burst of a second plurality of pulses, wherein generating the second burst of the second plurality of pulses comprises:

delivering, in a second pulsing state, a third pulse of the second plurality of pulses within a second burst of pulses, wherein the third pulse comprises a third voltage, a third period, and a third POT within the third period; and delivering, in the second pulsing state, a fourth pulse of the second plurality of pulses within the second burst of pulses, wherein the fourth pulse comprises a fourth voltage, a fourth period, and a fourth POT within the third period, and wherein the first voltage, the second voltage, the third voltage, and the fourth voltage are each different.

12. The method of claim 11, wherein the second period follows the first period, wherein the third period follows the second period, and wherein the fourth period follows the third period.

13. The method of claim 11, wherein the POT of the first pulse and the POT of the second pulse are different.

14. The method of claim 13, wherein the POT of the third pulse and the POT of the fourth pulse are different.

15. A waveform generator, comprising:

a system controller coupled to the waveform generator, the system controller comprising memory that includes computer-executable instructions and one or more processors configured to execute the computer-executable instructions and, individually or collectively, cause the waveform generator to generate a first burst of a first plurality of pulses by:

delivering, in a first pulsing state, a first pulse of the first plurality of pulses within a first burst of pulses, wherein the first pulse comprises a first voltage, a first period, and a first pulse-on-time (POT) within the first period, and at least one of delaying the delivering of the first pulse for a first sub-period of time after the delivery of a synchronization signal or halting the delivering of the first pulse for a second sub-period of time; and delivering, in the first pulsing state, a second pulse of the first plurality of pulses within the first burst of pulses, wherein the second pulse comprises a second voltage, a second period, and a second POT within the second period; and the one or more processors are further configured to execute the computer-executable instructions and, individually or collectively, cause the waveform generator to generate a second burst of a second plurality of pulses by:

delivering, in a second pulsing state, a third pulse of the second plurality of pulses within a second burst of pulses, wherein the third pulse comprises a third voltage, a third period, and a third POT within the third period; and delivering, in the second pulsing state, a fourth pulse of the second plurality of pulses within the second burst of pulses, wherein the fourth pulse comprises a fourth voltage, a fourth period, and a fourth POT within the third period, and wherein the first voltage, the second voltage, the third voltage, and the fourth voltage are each different.

16. The waveform generator of claim 15, wherein the second period follows the first period, wherein the third period follows the second period, and wherein the fourth period follows the third period.

17. The waveform generator of claim 15, wherein the POT of the first pulse is different than the POT of the second pulse, or the POT of the third pulse is different than the POT of the fourth pulse.

* * * * *